June 24, 1958 A. MILLER 2,840,711
VARIABLE FREQUENCY OSCILLATORS
Filed Jan. 4, 1954
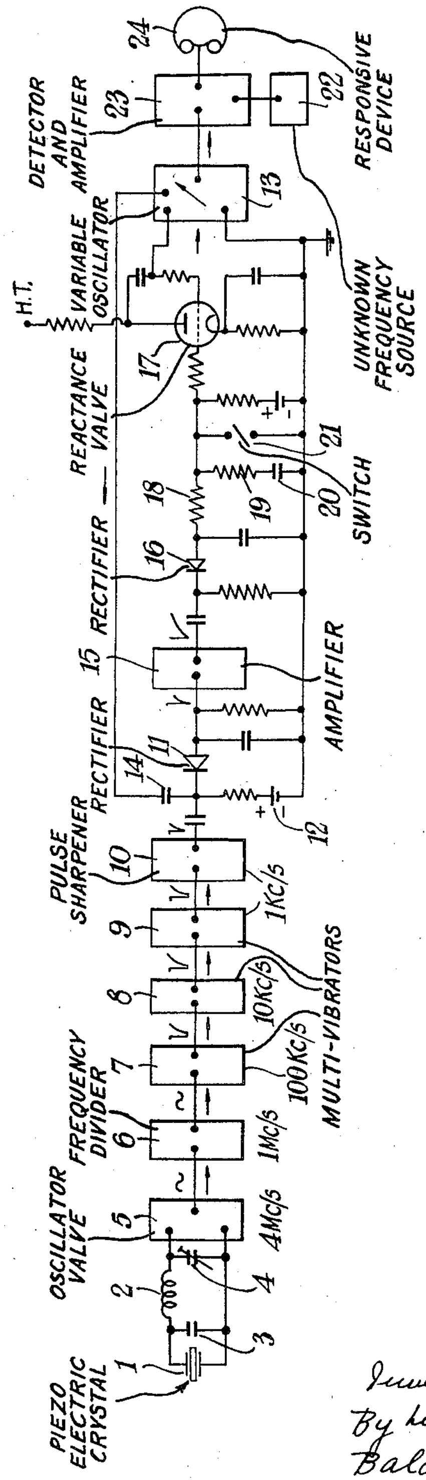
Inventor: Alan Miller
By his attorneys
Baldwin & Wight

United States Patent Office 2,840,711

Patented June 24, 1958

2,840,711

VARIABLE FREQUENCY OSCILLATORS

Alan Miller, Chelmsford, England, assignor to Marconi's Wireless Telegraph Company Limited, London, England, a British company Application January 4, 1954, Serial No. 401,761

Claims priority, application Great Britain January 8, 1953

5 Claims. (Cl. 250—36)

This invention relates to variable frequency oscillation generating arrangements. The object of the invention is to provide an improved variable frequency oscillator which has the wide range of a conventional inductance-capacity oscillator with the high stability and discrimination of a crystal oscillator.

According to this invention a variable frequency oscillation generator arrangement comprises a stabilized source of high frequency oscillations which is preferably adjustable in frequency over a small range, a pulse generator system synchronized by said source and adapted to produce pulses at a comparatively low frequency which is a sub-harmonic of the frequency of said source, a variable frequency oscillator, means for mixing oscillations produced by said oscillator with pulses produced by said pulse generator, means responsive to phase differences between the pulses from said pulse generator and oscillations from said oscillator for producing a control voltage and means controlled by said control voltage for automatically adjusting the frequency of said oscillator to maintain said phase difference substantially constant.

In an arrangement in accordance with the present invention the variable frequency oscillator is phase locked by pulses which are sub-harmonically related to the stabilized and preferably adjustable source of high frequency oscillations. The sub-harmonic pulse frequency is chosen at a suitably low value so that, as the variable frequency oscillator is tuned manually over its range it passes through a succession of closely spaced frequencies at each of which it may be controlled by phase locking. In addition the gap between any two adjacent locking points may be bridged by making the stabilized source adjustable over a small range of frequency. Thus, when the variable frequency oscillator has been locked at any selected point within its range, it may be tuned continuously as far as the next locking frequency by adjusting the stabilized source, so that the overall result is that of an oscillator which is of stability corresponding to that of the stabilized source, i. e. of crystal stability, but is nevertheless tunable continuously over a wide range. To quote a typical practical example, in a case of a variable oscillator tunable over a range of (say) from 5 to 6 mc./s., the sub-harmonic pulse frequency may be 1 kc./s. in which case the locking frequencies will be only 1 kc./s. apart and the gaps between these frequencies can be bridged by providing only a very small range of adjustment of stabilized source frequency, namely a variation of 1 part in 5,000.

The invention is illustrated in the accompanying drawing which shows partly in block diagrammatic and partly in normal diagrammatic form a preferred embodiment. In describing this embodiment typical practical numerical figures will be given but this is purely by way of example and the invention is not limited to the choice of these particular figures. In the diagram wave forms are indicated conventionally in various parts of the circuit.

Referring to the drawing which shows a system designed to be variable over a range of 5 to 6 mc./s., there is provided a crystal stabilized oscillator operating at 4 mc./s. and comprising a piezo electric crystal 1 which is connected through an impedance inverting network consisting of an inductance 2 and condensers 3 and 4, to an ordinary valve oscillation maintaining circuit represented by the block 5. The condenser 4, which may be a simple straight line capacity trimmer condenser with a linear scale, is used for adjustment purposes, the impedance inverting network enabling the crystal frequency to be varied at either side of its series resonance frequency. This adjustable crystal stabilized oscillator is known per se being described in British Patent No 618,-967 of March 2, 1949.

Output from this oscillator is fed to a frequency divider 6 of known form and which, in the present example, divides by a factor of four, producing a frequency of 1 mc./s. This is in turn fed to a known multi-vibrator 7 operating, in the present example, at 100 kc./s. and synchronized by the output from the divider 6 to produce pulses at this frequency. The multi-vibrator 7 synchronizes a second known multi-vibrator 8 which in turn synchronizes a third known multi-vibrator 9, the multi-vibrators 8 and 9 operating at 10 kc./s. and 1 kc./s. respectively.

The 1 kc./s. output from the multi-vibrator 9 is fed to any convenient form of pulse sharpener 10 which sharpens the 1 kc. pulses.

The sharpened negative going 1 kc./s. pulses from the pulse sharpener 10 are applied to one side of a germanium or other suitable rectifier 11 which is suitably biassed positively as by a bias source 12. Output taken from a calibrated variably tunable oscillator 13 having a tuning range of, for example, 5 to 6 mc./s. is fed back through condenser 14 and combined with the pulses from the sharpener 10 at the input side of the rectifier 11. The output from the crystal rectifier 11 will consist of pulses whose amplitude will be dependent on the phase relation between the two inputs. These pulses are amplified and broadened to approximately saw tooth shape in a suitable amplifier 15 and fed to a second germanium or other rectifier 16 the output from which will be a phase-dependent control voltage. This control voltage is employed to control in a manner known per se the reactance presented by a valve 17 connected to act as a variable reactance in the tuned circuit of the oscillator 13, the control voltage appropriately varying this reactance to adjust the frequency of the oscillator 13 so that the phase difference between the output from the pulse sharpener 10 and the oscillator 13 is maintained almost constant. The tuned circuit of the oscillator 13 is not separately shown being in the block marked 13.

As will be seen the crystal rectifier 16 is connected to the grid of the valve 17 through a circuit which includes a series resistance 18, which may, for example, be of 1 megohm, and a shunt path including a resistance 19 of, for example, 47,000 ohms and a condenser 20 of, for example, 1 micro-farad. The purpose of the network comprising the elements 19 and 20 is as follows. There is in parallel with this network a switch 21. While the switch 21 is closed the oscillator 13 is free running in an unlocked condition. When the said switch is opened a sharp inpulse of locking voltage is applied to the grid of the valve 17. If this voltage were large the frequency of the oscillator 13 might be "pulled" by several kc./s. before being locked. However, with the circuit shown the condenser 20 behaves as a virtual short circuit for such sharp impulses and the locking voltage actually applied to the grid of the valve 17 when the switch 21 is opened is greatly reduced by the resistances 18 and 19. This produces in practice the result that the "switch on" effectiveness of the valve 17 is made substantially below 1 kc./s. For slow changes, however, due for example to thermal drift of the oscillator 13, the full locking voltage is available and the locking range is several kc./s.

The output from the locked calibrated variable oscillator 13 may be used for any desired purpose. As illustrated it is represented as being used for measuring the frequency from some other source 22 the output from which is mixed with the output from the oscillator 13 in a detector and low frequency amplifier 23 which feeds a beat frequency responsive device represented as a pair of telephones 24.

With the arrangement illustrated the output from the crystal oscillator operated at 4 mc./s. is divided to produce 1 kc./s. pulses which are then used for phase-locking the calibrated oscillator 13. The crystal frequency control provided by the adjustable condenser 4 therefore acts as a fine control of the frequency of the locked oscillator 13. The available frequency adjustment of the oscillator 1 is made sufficient to bridge the gap between any two adjacent locking points. In practice, the discrimination of this control may be made of the order of 1 part in a million with a long-time frequency stability of the order of half a part in a million and a much better short-time stability. The overall result is accordingly a continuously variable oscillator of desired wide range (in this case 5 to 6 mc./s.) and high discrimination and stability as exemplified by the figures just given.

If desired the embodiment described above may be modified by employing a crystal oscillator which operates at a lower frequency, for example, one operating at 100 kc./s., and in this case the frequency divider 6 and multi-vibrator 7 would be omitted, and the stage 8 operating at 10 kc./s. driven directly by the 100 kc./s. oscillator.

While I have described my invention in one of its preferred embodiments, I realize that modifications may be made, and I desire that it be understood that no limitations upon my invention are intended other than may be imposed by the scope of the appended claims.

I claim:

1. A variable frequency oscillation generator arrangement comprising a stabilized source of high frequency oscillations consisting of a crystal controlled variable frequency oscillator having tuning means connected therewith for tuning said oscillator over a limited frequency range, a generator of pulses synchronized by said source so that the frequency of said pulses is a sub-harmonic of said source, a pulse sharpener, a variably tunable oscillator, means for feeding the pulses to said pulse sharpener, a phase discriminator, means for feeding the output of the pulse sharpener and the output from the variably tunable oscillator to said phase discriminator whereby a control voltage is produced that is dependent upon the phase differences between said pulses and the oscillations from said variably tunable oscillator, said control voltage operating to phase lock the variably tunable oscillator to said pulses wherein said variably tunable oscillator is effectively stabilized by said stabilized source with substantially crystal stability over a continuous band of operating frequencies.

2. A variable frequency oscillation generator arrangement as set forth in claim 1, in which there is a variable reactance connected with said variably tunable oscillator constituted by a reactance valve having an input circuit and an output circuit, a rectifier having an input and an output circuit, means for impressing the pulses from said sharpener and the output from said variably tunable oscillator upon the input circuit of said rectifier and means connecting the output of said rectifier with the input circuit of said reactance valve through a series resistance and a switch connected across the input circuit of said reactance valve and movable either to an open and closed position and operating to prevent said control voltage from affecting said reactance valve when the switch is closed.

3. A variable frequency oscillation generator arrangement as set forth in claim 1, wherein the stabilized source comprises a piezo electric crystal connected through an impedance inverting network to a valve oscillation maintaining circuit, said network including an element of adjustable reactance for effecting adjustment of the frequency of said stabilized source over said range.

4. A variable frequency oscillation generator arrangement as set forth in claim 1, wherein the generator of pulses includes a multi-vibrator arranged to operate at a frequency which is a sub-harmonic of the frequency of said source, said multi-vibrator being synchronized from said source.

5. A variable frequency oscillation generator arrangement as set forth in claim 1, wherein the frequency of said variably tunable oscillator is adjusted by means of a variable reactance connected with said variably tunable oscillator, said control voltage being arranged to effect control of said reactance.

References Cited in the file of this patent

UNITED STATES PATENTS

| | | |
|---|---|---|
| 2,236,532 | Gibbs | Apr. 1, 1941 |
| 2,437,609 | Mayle | Mar. 9, 1948 |
| 2,479,180 | Norrman | Aug. 16, 1949 |
| 2,490,500 | Young | Dec. 6, 1949 |
| 2,595,608 | Robinson et al. | May 6, 1952 |
| 2,605,425 | Hugenholtz | July 29, 1952 |
| 2,623,177 | Hugenholtz | Dec. 23, 1952 |
| 2,627,033 | Jensen et al. | Jan. 27, 1953 |
| 2,774,872 | Howson | Dec. 18, 1956 |